United States Patent [19]
Estakhri et al.

[11] Patent Number: 6,122,195
[45] Date of Patent: Sep. 19, 2000

[54] METHOD AND APPARATUS FOR DECREASING BLOCK WRITE OPERATION TIMES PERFORMED ON NONVOLATILE MEMORY

[75] Inventors: Petro Estakhri, Pleasanton; Berhanu Iman, Sunnyvale, both of Calif.

[73] Assignee: Lexar Media, Inc., Fremont, Calif.

[21] Appl. No.: 09/330,278

[22] Filed: Jun. 11, 1999

Related U.S. Application Data

[63] Continuation-in-part of application No. 09/283,728, Apr. 1, 1999, which is a continuation-in-part of application No. 09/264,340, Mar. 8, 1999, which is a continuation of application No. 08/831,266, Mar. 31, 1997, Pat. No. 5,907,856.

[51] Int. Cl.[7] .................................................. G11C 16/04
[52] U.S. Cl. ............................. 365/185.11; 365/185.12; 365/185.33; 365/230.03
[58] Field of Search .......................... 365/185.11, 185.12, 365/185.33, 189.01, 230.03

[56] References Cited

U.S. PATENT DOCUMENTS

| | | | |
|---|---|---|---|
| 4,210,959 | 7/1980 | Wozniak | 364/200 |
| 4,355,376 | 10/1982 | Gould | 365/230 |
| 4,405,952 | 9/1983 | Slakmon | 360/49 |

(List continued on next page.)

FOREIGN PATENT DOCUMENTS

| | | | |
|---|---|---|---|
| 0 557 723 | 1/1987 | Australia | G11C 5/00 |
| 0 220 718 A2 | 5/1987 | European Pat. Off. | G06F 15/40 |
| 0 243 503 A1 | 11/1987 | European Pat. Off. | G11B 20/10 |
| 0 424 191 A2 | 4/1991 | European Pat. Off. | G06F 11/00 |
| 0 489 204 A1 | 6/1992 | European Pat. Off. | G11C 16/06 |
| 0 522 780 A2 | 1/1993 | European Pat. Off. | G06F 3/06 |
| 0 544 252 A2 | 6/1993 | European Pat. Off. | G11C 16/06 |
| 0 686 976 A2 | 12/1995 | European Pat. Off. | G11C 16/06 |
| 93 01908 | 8/1993 | France | G06F 12/02 |
| 59-45695 | 9/1982 | Japan | G11C 17/00 |
| 58-215794 | 12/1983 | Japan | G11C 17/00 |
| 58-215795 | 12/1983 | Japan | G11C 17/00 |
| 59-162695 | 9/1984 | Japan | G11C 17/00 |
| 60-212900 | 10/1985 | Japan | G11C 29/00 |
| 61-96598 | 5/1986 | Japan | G11C 17/00 |
| 62-283496 | 12/1987 | Japan | G11C 17/00 |
| 62-283497 | 12/1987 | Japan | G11C 17/00 |
| 63-183700 | 7/1988 | Japan | G11C 17/00 |
| 4-332999 | 11/1992 | Japan | G11C 29/00 |
| 84/00628 | 2/1984 | WIPO | G06F 11/20 |

OTHER PUBLICATIONS

Book—*Computer Architecture and Parallel Processing*, Kai Hwang & Faye A. Briggs, McGraw–Hill Book Co., © 1984, p. 64.

Magazine—"State of the Art: Magnetic VS. Optical Store Data in a Flash", by Walter Lahti and Dean McCarron, Byte magazine dated Nov. 1, 1990, 311, vol. 15, No. 12.

Magazine—Technology Updates, Integrated Circuits, "1–Mbit flash memories seek their role in system design", Ron Wilson, Senior Editor, Computer Design magazine 28 (1989) Mar. 1, No. 5, Tulsa OK, US, pp. 30 and 32.

*Primary Examiner*—Son T. Dinh
*Attorney, Agent, or Firm*—Maryam Imam

[57] ABSTRACT

In accordance with an embodiment of the present invention, a solid state storage system and method is disclosed for reducing the number of write operations when re-writing a block of information that has been previously written by a host. The system includes a controller coupled to a host and a nonvolatile memory unit for controlling reading and writing of information organized in sectors from and to the nonvolatile memory unit, as commanded by the host. The controller maintains mapping of the sector information in an LUT stored in volatile memory the contents of which are lost if power is lost. Through the use of an address value and flag information maintained within each of the blocks of the nonvolatile memory unit, a block is re-written using a different number of write operations in various alternative embodiments of the present invention. The flag information is indicative of the status of the block such that during power-up, the controller reads the address value and the flag information of a block and determines the status of the block and in accordance therewith finishes re-writing of the block, if necessary and updates the LUT accordingly.

18 Claims, 8 Drawing Sheets

U.S. PATENT DOCUMENTS

| Patent # | Date | Inventor | Class |
|---|---|---|---|
| 4,450,559 | 5/1984 | Bond et al. | 371/10 |
| 4,456,971 | 6/1984 | Fukuda et al. | 364/900 |
| 4,498,146 | 2/1985 | Martinez | 364/900 |
| 4,525,839 | 7/1985 | Nozawa et al. | 371/38 |
| 4,616,311 | 10/1986 | Sato | 364/200 |
| 4,654,847 | 3/1987 | Dutton | 371/10 |
| 4,710,871 | 12/1987 | Belknap et al. | 364/200 |
| 4,746,998 | 5/1988 | Robinson et al. | 360/72.1 |
| 4,748,320 | 5/1988 | Yorimoto et al. | 235/492 |
| 4,757,474 | 7/1988 | Fukushi et al. | 365/189 |
| 4,774,700 | 9/1988 | Satoh et al. | 369/54 |
| 4,800,520 | 1/1989 | Iijima | 364/900 |
| 4,896,262 | 1/1990 | Wayama et al. | 364/200 |
| 4,914,529 | 4/1990 | Bonke | 360/48 |
| 4,920,518 | 4/1990 | Nakamura et al. | 365/228 |
| 4,924,331 | 5/1990 | Robinson et al. | 360/72.1 |
| 4,953,122 | 8/1990 | Williams | 364/900 |
| 5,070,474 | 12/1991 | Tuma et al. | 395/500 |
| 5,168,465 | 12/1992 | Harari | 257/320 |
| 5,198,380 | 3/1993 | Harari | 437/43 |
| 5,200,959 | 4/1993 | Gross et al. | 371/21.6 |
| 5,226,168 | 7/1993 | Kobayashi et al. | 395/800 |
| 5,268,318 | 12/1993 | Harari | 437/43 |
| 5,268,870 | 12/1993 | Harari | 365/218 |
| 5,270,979 | 12/1993 | Harari et al. | 365/218 |
| 5,293,560 | 3/1994 | Harari | 365/185 |
| 5,297,148 | 3/1994 | Harari et al. | 371/10.2 |
| 5,303,198 | 4/1994 | Adachi et al. | 365/218 |
| 5,315,541 | 5/1994 | Harari et al. | 365/63 |
| 5,337,275 | 8/1994 | Garner | 365/189.01 |
| 5,341,330 | 8/1994 | Wells et al. | 365/185 |
| 5,341,339 | 8/1994 | Wells | 365/218 |
| 5,353,256 | 10/1994 | Fandrich et al. | 365/230.03 |
| 5,357,475 | 10/1994 | Hasbun et al. | 365/218 |
| 5,369,615 | 11/1994 | Harari et al. | 365/218 |
| 5,388,083 | 2/1995 | Assar et al. | 365/218 |
| 5,396,468 | 3/1995 | Harari et al. | 365/218 |
| 5,418,752 | 5/1995 | Harari et al. | 365/218 |
| 5,422,842 | 6/1995 | Cernea et al. | 365/185 |
| 5,428,621 | 6/1995 | Mehrotra et al. | 371/21.4 |
| 5,430,859 | 7/1995 | Norman et al. | 395/425 |
| 5,434,825 | 7/1995 | Harari | 365/185 |
| 5,438,573 | 8/1995 | Mangan et al. | 371/10.3 |
| 5,471,478 | 11/1995 | Mangan et al. | 371/10.3 |
| 5,479,638 | 12/1995 | Assar et al. | 395/430 |
| 5,485,595 | 1/1996 | Assar et al. | 395/430 |
| 5,495,442 | 2/1996 | Cernea et al. | 365/185.03 |
| 5,504,760 | 4/1996 | Harari et al. | 371/40.1 |
| 5,508,971 | 4/1996 | Cernea et al. | 365/185.23 |
| 5,524,230 | 6/1996 | Sakaue et al. | 395/430 |
| 5,532,962 | 7/1996 | Auclair et al. | 365/201 |
| 5,532,964 | 7/1996 | Cernea et al. | 365/189.09 |
| 5,534,456 | 7/1996 | Yuan et al. | 437/43 |
| 5,535,328 | 7/1996 | Harari et al. | 395/182.05 |
| 5,544,118 | 8/1996 | Harari | 365/218 |
| 5,544,356 | 8/1996 | Robinson et al. | 395/600 |
| 5,554,553 | 9/1996 | Harari | 437/43 |
| 5,563,825 | 10/1996 | Cernea et al. | 365/185.18 |
| 5,566,314 | 10/1996 | DeMarco et al. | 395/430 |
| 5,568,439 | 10/1996 | Harari | 365/218 |
| 5,583,812 | 12/1996 | Harari | 365/185.33 |
| 5,592,420 | 1/1997 | Cernea et al. | 365/185.18 |
| 5,642,312 | 6/1997 | Harari | 365/185.33 |
| 5,663,901 | 9/1997 | Wallace et al. | 365/52 |
| 5,693,570 | 12/1997 | Cernea et al. | 437/205 |
| 5,712,819 | 1/1998 | Harari | 365/185.29 |
| 5,719,808 | 2/1998 | Harari et al. | 365/185.33 |
| 5,778,418 | 7/1998 | Auclair et al. | 711/101 |

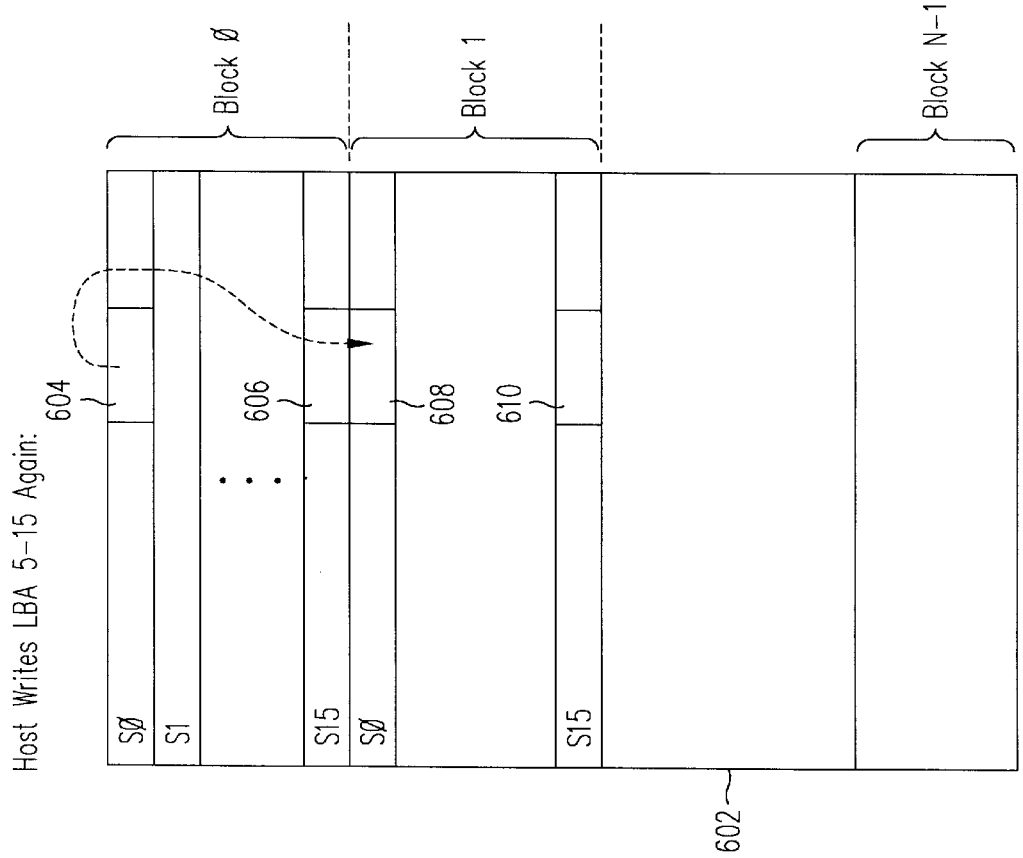
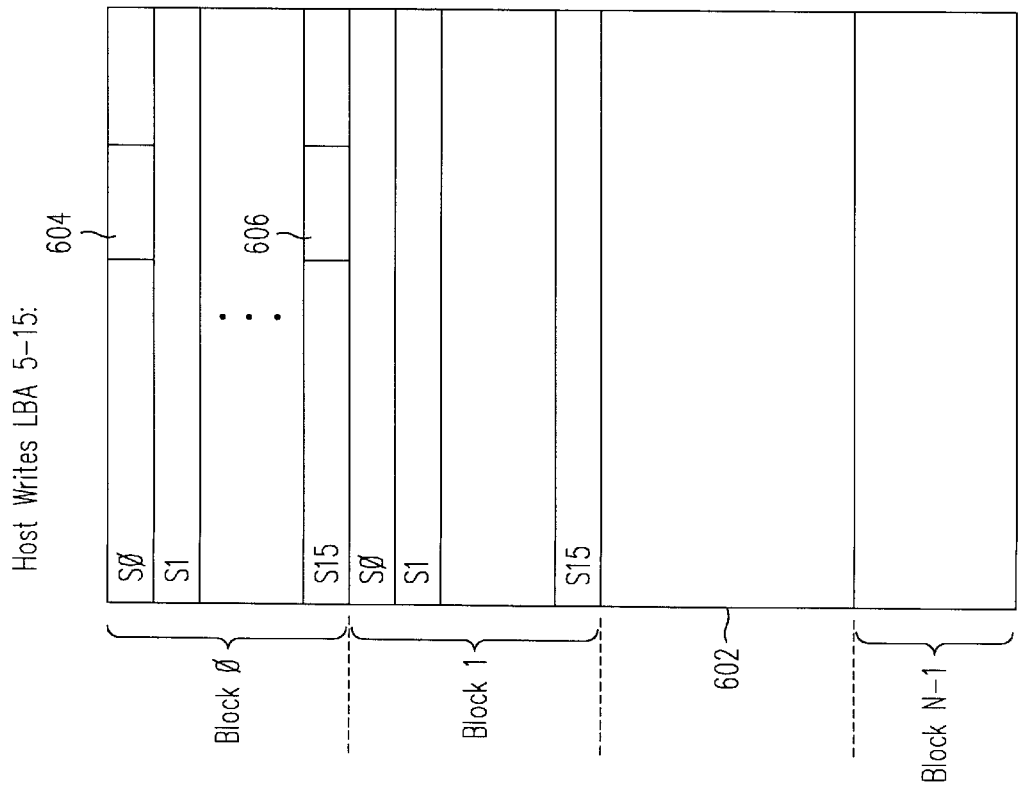

METHOD AND APPARATUS FOR DECREASING BLOCK WRITE OPERATION TIMES PERFORMED ON NONVOLATILE MEMORY

CROSS REFERENCE TO RELATED APPLICATIONS

This application is a continuation-in-part of a previously-filed application, entitled "SPACE MANAGEMENT FOR MANAGING HIGH CAPACITY NONVOLATILE MEMORY", application Ser. No. 09/283,728, filed on Apr. 1, 1999, the inventors of which are Petro Estakhri, Berhanu Iman and Min Guo and another previously-filed application, entitled "MOVING SECTORS WITHIN A BLOCK OF INFORMATION IN A FLASH MEMORY MASS STORAGE ARCHITECTURE", application Ser. No. 09/264,340, filed on Mar. 8, 1999, the inventors of which are Petro Estakhri, Berhanu Iman and Ali Ganjuei, which is continuation of application Ser. No. 08/831,266, filed Mar. 31, 1997, now U.S. Pat. No. 5,907,856, entitled "MOVING SECTORS WITHIN A BLOCK OF INFORMATION IN A FLASH MEMORY MASS STORAGE ARCHITECTURE". The disclosure of both of these patent documents is incorporated by reference herein as though set forth in full.

BACKGROUND OF THE INVENTION

1. Field of the Invention

This invention relates to the field of digital systems employing non-volatile memory and particularly flash memory as mass storage for computers, digital cameras and the like.

2. Description of the Prior Art

Recently, solid state memory has gained popularity for use in replacing mass storage units in various technology areas such as computers, digital cameras, modems and the like. For example, in digital cameras, the use of solid state memory, such as flash memory, replaces conventional films.

Flash memory is generally provided in the form of semiconductor devices (or chips) with each device made of a large number of transistor memory cells and each cell being individually programmable. The programming (or writing) and erasing of such a memory cell is limited to a finite number of erase-write cycles, which basically determines the lifetime of the device. Furthermore, an inherent characteristic of flash memory cells is that they must be erased and verified for successful erase prior to being programmed.

With the use of flash memory, however, the area of memory that once contained information must first be erased prior to being re-programmed. In a flash memory device, write and erase cycles are generally slow and can significantly reduce the performance of a system utilizing flash memory as its mass storage.

In applications employing flash memory devices, such as personal computers and digital cameras, a host writes and reads information to the flash memory devices through a controller device, which is commonly in the form of a semiconductor device. Such information is organized in sectors with each sector including user data information and overhead information. The user data portion of a sector is typically 512 bytes in length although other size sectors may be similarly employed. The controller, upon receiving sector information from the host, during a host-commanded write operation, writes the information to the flash memory devices in accordance with a predetermined sector organization. While the host may be accessing multiple sectors, each sector is written to the flash devices one at a time.

Currently, in computers wherein large files such as commercial software and user programs are stored within flash memory and in digital cameras wherein large picture files are stored within flash devices, the files are written one sector at a time within flash. Due to the latency associated with each write operation, the performance of these systems when storing large quantities of information is limited.

In storing, and/or retrieving a data file (data files may be any computer files including commercial software, user program, word processor software document, spread sheet file and the like), a computer (or host) system provides what is referred to as the logical block address indicating the location of where the host believes the data file to exist within the mass storage. The host-provided address may be in the form of cylinder, head and sector (CHS), which is converted to a logical block address format upon receipt by the controller. The same applies to digital camera applications. The controller then translates the logical block address (LBA) into a physical block address (PBA) and uses the latter to access the data file within flash memory. Each time a data file is changed, the latest version of the file is stored in an available (or 'unused') location within the flash memory that is identified by a new physical location (or new PBA). Upon using much of the free or available locations within the flash memory for updated files, an erase operation may be needed to make available 'old' locations for storage of additional information. Since erase operations are time-consuming (as are write operations), there is a trade-off as to the frequency of performing erase operations to the time expended for searching for free locations within the flash memory as more and more locations are used prior to the next erase operation.

A variety of different algorithms may be employed for determining when an erase operation(s) will take place and as a function thereof, where within the flash memory (mass storage) the next available free block is located for storing the data file. The space manager unit of the controller device performs this function.

Information in the nonvolatile memory or flash memory is stored under the direction of the controller and it is done so in the form of sectors and a number of sectors define a block. A block may include 16, 32 or other number of sectors. But once blocks are determined to include a predetermined number of sectors, this determined size defines each block. Thus, information that is stored in nonvolatile memory is organized in blocks and each block is uniquely addressable by the controller. Each block is further comprised of multiple sectors with each sector being defined by 512 bytes plus additional storage space for storing non-data information, such as flags, address and error correction code (ECC) information. Although a sector may have data storage spaces other than 512 bytes. In some prior art systems, during an erase operation, an entire block is erased whereas in other prior art systems, the sector may be erased. Each sector within a block is uniquely, addressable for reading and writing information from and to the nonvolatile memory. A unique value is maintained within each block that contains sector information as a Virtual Logical Block Address (VLBA) for use in reconstructing the addressing or mapping information associated with the nonvolatile memory during power-up. This mapping information is the contents of a look-up-table maintained in volatile memory, as will now be further described.

The space manager unit of the controller device maintains a table of information regarding the location of the most recent data within the flash memory in addition to the location of information that is considered 'old' (information which has been superseded) and not yet erased and/or 'defective' (location can not be used for storing information due to some kind of defect) or 'used' (currently contains up-to-date information). This table of information is stored and updated in a volatile memory location such as RAM either within or outside of the controller device. Each time information is accessed by the host, the space manager table is used to find out the location of the information that is to be written and/or read from the flash memory devices.

The problem with prior art methods and apparatus using nonvolatile memory devices is that when, for example, a block of information within a particular nonvolatile memory device is written to, there are many write operations associated therewith. For example, currently, to write a block that includes 16 sectors, there are at least twenty write operations performed, 16 to write the sectors and 4 more to write non-sector information. This substantially affects system performance because write operations performed on nonvolatile memory are generally time-consuming and each time a block is accessed, it must be moved to a different location within nonvolatile memory, which requires writing of the block. When blocks are accessed over and over again, there are many move operations requiring writing of the block that take place.

Therefore, the need arises for a method and apparatus to efficiently perform writing to a is block of nonvolatile memory where the block include multiple sectors.

SUMMARY OF THE INVENTION

Briefly, a preferred embodiment of the present invention includes a solid state storage system and method for reducing the number of write operations when re-writing a block of information that has been previously written by a host. The system includes a controller coupled to a host and a nonvolatile memory unit for controlling reading and writing of information organized in sectors from and to the nonvolatile memory unit, as commanded by the host. The controller maintains mapping of the sector information in an LUT stored in volatile memory the contents of which are lost if power is lost. Through the use of an address value and flag information maintained within each of the blocks of the nonvolatile memory unit, a block is re-written using a different number of write operations in various alternative embodiments of the present invention. The flag information is indicative of the status of the block such that during power-up, the controller reads the address value and the flag information of a block and determines the status of the block and in accordance therewith finishes re-writing of the block, if necessary and updates the LUT accordingly.

The foregoing and other objects, features and advantages of the invention will be apparent from the following detailed description of the preferred embodiments which made reference to the several figures of the drawing.

IN THE DRAWING

FIGS. 6a and 6b show an example of the contents of nonvolatile memory in accordance with yet another embodiment of the present invention wherein 16 write operations are performed when re-writing a block.

DETAILED DESCRIPTION OF THE PREFERRED EMBODIMENTS

Figure 1:
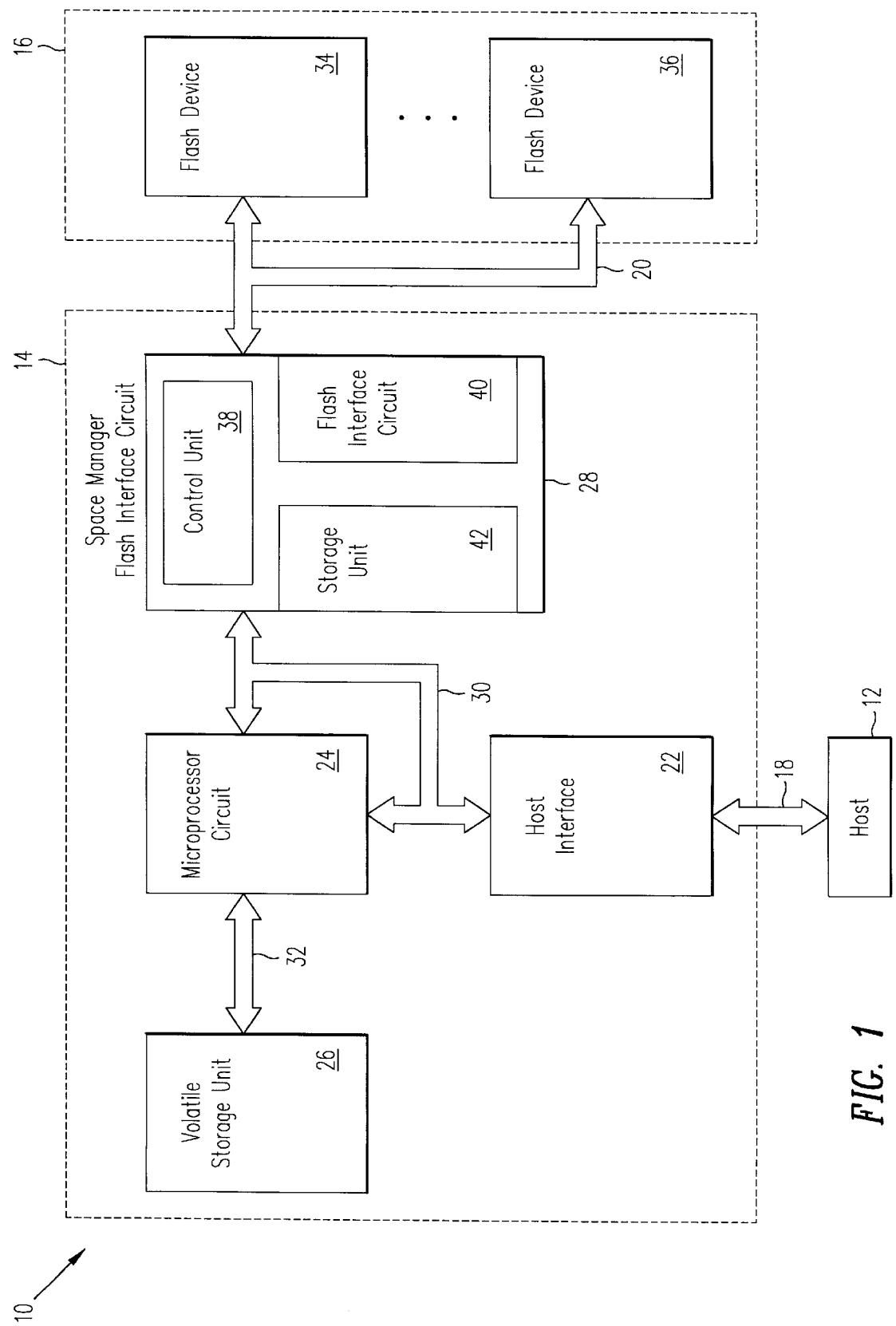
FIG. 1 shows a digital system in accordance with an embodiment of the present invention.

Referring now to FIG. 1, a digital system 10, which may be a part of a computer (personal computer (PC)), digital camera and the like is shown in accordance with an embodiment of the present invention to include a host 12, a controller device 14 and a nonvolatile memory unit 16. The host 12 is shown to be coupled to read information from and write information to the memory unit 16 under the direction of the controller device 14. The memory unit 16, as depicted, is comprised of at least two nonvolatile memory devices in accordance with the present invention. Each of the nonvolatile memory devices is an integrated circuit (or semiconductor device, as commonly referred to by the industry). The nonvolatile memory devices may be flash, EEPROM (Electronically Erasable Programmable Read Only Memory) or other type of solid state memory.

The host 12 is shown to communicate with the controller 14 through host bus 18 and the controller device 14 is shown coupled to the memory unit 16 through memory signals 20.

The controller device 14 is an integrated circuit (or semiconductor) shown to include a host interface circuit 22, a microprocessor circuit 24, a volatile storage unit 26 and a space manager/flash interface circuit 28. The host interface circuit 22 is for coupling the host 12 through host bus 18, which includes an address bus, a bi-directional data bus and control signals (not shown separately). Depending on the architecture of the host being employed, the host address and data busses may be comprised of a single bus carrying both address and data information by multiplexing address and data signals onto the same bus. It should be noted that the term bus as used herein includes multiple electrical conductors or signal lines. The host bus 18 may be a PCMCIA interface, an ATA interface or other kinds of interfaces employed by the industry.

The host interface circuit 22 is shown coupled to the host bus 18 and is further shown to be coupled through a microprocessor bus 30 to the microprocessor circuit 24. Microprocessor circuit 24 is further coupled to the space manager/flash interface circuit 28 through the microprocessor bus 30, which facilitates communication of address and data information and control signals therebetween. The microprocessor circuit 24 is coupled to read and write information to the volatile storage unit 26 through a volatile storage bus 32.

In one embodiment of the present invention, the microprocessor circuit 24 is an Intel 8051 processor and alternatively, the microprocessor unit 24 may be any general-purpose processor unit. The volatile storage unit 26 is generally a read-access memory (RAM) for storing firmware code that is executed by the microprocessor circuit 24. Information between the host 12 and the controller 14 is transferred through the host bus 18 and information between the controller 14 and the memory unit 16 is coupled through the memory signals 20. The memory unit 16 is comprised of two or more nonvolatile memory devices, such as 34 and 36. The size of each of the nonvolatile memory devices 34 and 36 may vary depending on the application of the digital system 10. Nonetheless, this size is generally referred to by bytes where each byte is 8 bits. For example, in one application, the size of the nonvolatile memory unit 16 is 160 MB (mega bytes) together with each flash or nonvolatile memory device being 32 MB. In another application, the size of the nonvolatile memory unit 16 is 80 MB with each flash memory device being 16 MB. The nonvolatile memory devices 34 and 36 are of the memory type that preserve their contents even during a power-down. Typical examples of nonvolatile memory devices are flash or EEPROM devices comprised of floating gate cells and manufactured by companies such as Toshiba, Hitachi and the like.

While not shown in FIG. 1, the space manager/flash interface circuit 28 includes a space manager control unit 38, a flash interface circuit 40 and a space manager storage unit 42. The space manager unit 38, in one embodiment of the present invention, is comprised of a state machine for controlling the information that is stored in a look-up-table (LUT) maintained within the space manager storage unit 42. Alternatively, the functions of the space manager control unit 38 may be performed by other types of hardware and/or software as understood by those of ordinary skill in the art. The space manager storage unit 42 is of a volatile type of memory, such as RAM, for storing block addressing and status information within the LUT.

Still not shown in FIG. 1, the memory signals 20 include a flash address bus, a bi-directional flash data bus and flash control signals. Some of these signals will be further described with respect to other figures included herein.

In operation, the host 12 accesses the memory unit 16 from time to time and during performance of various operations such as reading and writing to the memory unit 16. In doing so, the host 12 provides an address identifying a location for reading or writing of data. The host-provided address is coupled onto the host bus 18 for use by the controller 14 in accessing or reading information to and from the memory unit 16. In one embodiment, the host-provided address is in the form of CHS (cylinder, head and sector). This type of addressing is adopted from systems using hard disks where such an addressing scheme was used to identify a particular location on the disk. With the advent of nonvolatile memory for storage of information however, the CHS address format need be converted to a value for identifying a location within the nonvolatile memory unit. Thus, when a CHS address is coupled onto the host bus 18, the controller 14 converts the same to a logical block address (LBA). The LBA is then coupled through the microprocessor bus 30 for use by the space manager/flash interface unit 28. Alternatively, the host 12 provides an LBA type of address to the controller 14, in which case, while conversion is still performed, it is not a CHS to LBA conversion. The latter conversion merely displaces the LBA, as is also performed when the former conversion, i.e. CHS to LBA is used. The reader will note that as previously discussed herein, a block is defined to include a predetermined number of sectors, such as 16, 32 or other number of sectors.

The LBA calculation may be performed by hardware or firmware. In the case where firmware is used to calculate the LBA, the microprocessor 24 performs such function by execution of the firmware code stored in the volatile storage unit 26. In the case where hardware is used to calculate the LBA, a state machine block (not shown in FIG. 1) performs such a calculation.

After calculation of the LBA according to the equation hereinabove, the LBA is translated to a VLBA (Virtual Logical Block Address) value by masking certain least significant bits of the LBA. For example, in the case where 16 sectors per block is employed, the VLBA is calculated from the LBA by a logical 'AND' of the LBA with the hexadecimal value 0×3FFFF0. This essentially results in the LBA being preserved except for the 4 least significant bits thereof. In the case where 32 sectors per block are employed, the VLBA is calculated by a logic 'AND' of the LBA value with the hexadecimal value of 3×3FFFE0, which is effectively masking off the 5 least significant bits of the LBA and preserving the remaining bits, and so on. The translation of the LBA to VPBA is performed by the space manager/flash interface 28. This translation may be performed by either hardware or software.

In FIG. 1, the VLBA is then coupled onto the microprocessor bus 30 from the microprocessor 24 to the space manager control unit 38 of the space manager/flash interface circuit 28 where it is used to address the LUT (Look-Up-Table) of the space manager storage unit 42. In fact, the VLBA is used to address a particular location of the LUT wherefrom a VPBA (virtual physical block address) is retrieved. It should be noted that a particular LBA value may be used to point to various PBA values. For example, if the host wishes to write to a location that is identified by a particular LBA value, the particular LBA value is then used to look up a VPBA value in the LUT. This VPBA value may be, for example, '20' but the next time the host wishes to write to the same LBA-identified location, the VPBA value retrieved from the LUT may be '200' rather than '20'. The way in which this is done is with the use of certain flag information that is also maintained within the LUT. Briefly, the first time after an erase operation that a particular LBA location is being addressed by the host for writing thereto, the information is written and a flag field within the LUT corresponding the particular LBA is marked as 'used' so that the next time the host wishes to write to that same location prior to an erase operation, a different location within the memory unit 16 is identified by a different PBA for such writing. Accordingly, there is no one-to-one correspondence between the LBA and the PBA. For a further explanation of flag fields and the LBA and PBA LUT addressing, the reader is directed to a U.S. application filed on Mar. 31, 1997, entitled "Moving Sectors Within a Block of Information in a Flash Memory Mass Storage Architecture", the inventors of which are Petro Estakhri, Berhanu Iman and Ali R. Ganjuei and the disclosure of which is herein incorporated by reference as though set forth in full.

In PC applications, a block of information is typically a sector as employed in conventional hard disk drives, with each sector typically including space for 512 bytes of data and additional space for overhead information, although other-sized sectors may be similarly employed.

Microprocessor 24 executes instructions in the form of program code from the volatile memory unit 26 (such as ROM (read-only memory) or RAM (read-and-write memory)) located either within or outside of the microprocessor 24. The microprocessor 24 further instructs the space manager control unit 38 to use the LBA, originated by a CHS value provided by the host, to find the next unused (or free) addressable storage block location available within the memory unit 16. During a host write operation, this unused block location is stored in the LUT and during a host read operation, this unused block location is read from the LUT. The address value identifying the a location within the memory unit 16, as stored within the LUT, is referred to as a Virtual Physical Block Address (VPBA). The space manager control unit 38 may employ any one of a variety of algorithms to find the next available (or free) block located within the flash memory devices. An example of a space manager is disclosed in an earlier-issued patent. U.S. Pat. No. 5,485,595, entitled "Flash Memory Mass Storage Architecture Incorporating Wear Level Technique Without Using Cam Cells", issued on Jan. 16, 1996 with the inventors being Mahmud Assar, Petro Estakhri, Siamack Nemazie and Mahmood Mozaffari, the disclosure of which is herein incorporated by reference as though set forth in full. The reader is particularly directed to FIGS. 11–13 and discussions regarding the same. In alternative embodiments, however, other space management methods and apparatus may likewise be employed by the present invention.

The VLBA value is ultimately used to look up a VPBA value from the LUT. The LUT is comprised of rows and columns with each row being addressed by a VLBA value. During a read operation, the VLBA value is used to address a particular row of the LUT for retrieving therefrom, the VPBA, which includes certain flag information. During a write operation, the VLBA is used to address a particular row of the LUT for storing a VPBA value including certain flag information. The VPBA is ultimately translated to a Physical Block Address (PBA) for identifying a particular sector location within the memory unit 16.

The LBA value is coupled onto the microprocessor bus 30 by the microprocessor 24 for use by the space manager/flash interface 28 where it is translated to a VLBA address. Four bits of sector indicates the use of 16 sectors per block since 2 to the power of 4 equals 16. The VLBA is derived by masking the sector bits (the masked sector bits will be referred to as sector offset value), which in this example include 4 bits. The block and chip select information remain the same. The chip select bits are used to select a particular one of the plurality of nonvolatile memory devices included within the memory unit 16, such as one of the devices 34 or 36. The block information identifies a particular block within the selected nonvolatile memory device. The VLBA is also written to the nonvolatile memory as the block is stored, written or moved in the nonvolatile memory. That is, after writing all of the sectors of a block, the VLBA is written in the last row of the block. Alternatively, the VLBA may be written to any of the other rows of the block. This will be further explained with respect to the following figures.

Figure 2:
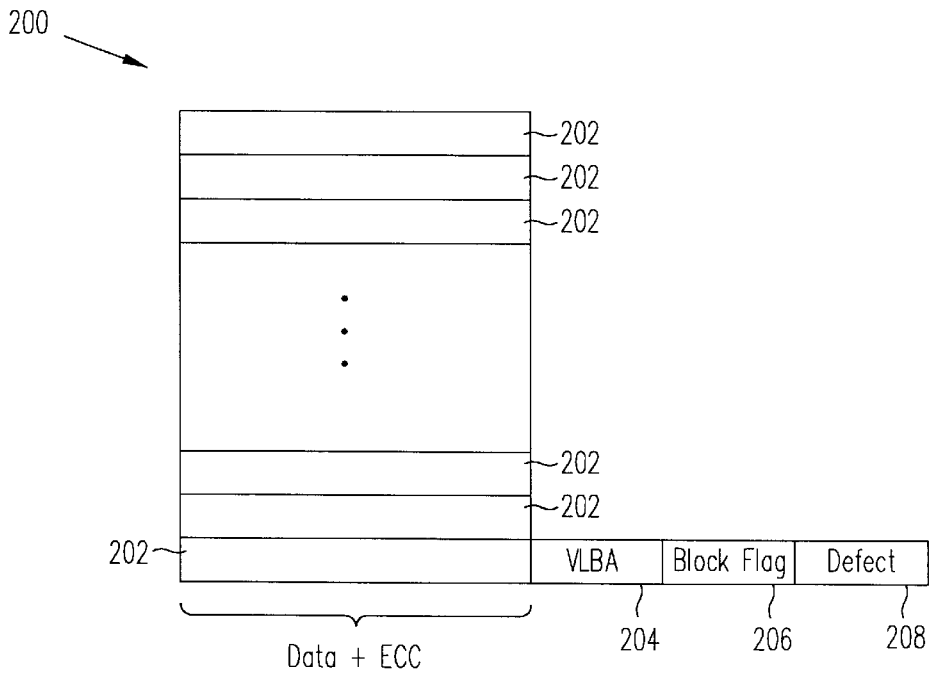
FIG. 2 shows an example of the organization of a block within one of the flash devices of the flash memory unit as employed in the digital system of FIG. 1.

Referring now to FIG. 2, a block 200 is shown to include 16 sectors, each sector storage space 202 is used to store data and ECC information. It should be noted that in alternative embodiments, the block 200 may include other than 16 sectors. For example, in a system having memory unit of capacity 128 Mbits, there may be 32 sectors used per block whereas using a capacity of 64 Mbit may require 16-sector blocks. In FIG. 2, each sector is stored in a row of storage space of the block 200.

As shown in FIG. 2, in the last row of the block 200, after the sector storage space 202, there is a VLBA field 204 for storing the VLBA, a block status flag field 206 and a defect field 208. The block status flag field 206 is used for storing the status of the block 200 as will become clear with reference to later examples provided herein. The defect field 208 is used for storing a flag indicating whether or not the block 200 is defective. In later examples, this field will be shown as 'GD' to indicate that the block is not defective although practically, there may be a byte (or 8 bits) dedicated to this field. The block status flag field 206 also occupies a byte and the VLBA field 204 occupies 2 bytes. The sizes of the fields 204–208 are design choices and may be different than that stated herein.

Figure 3:
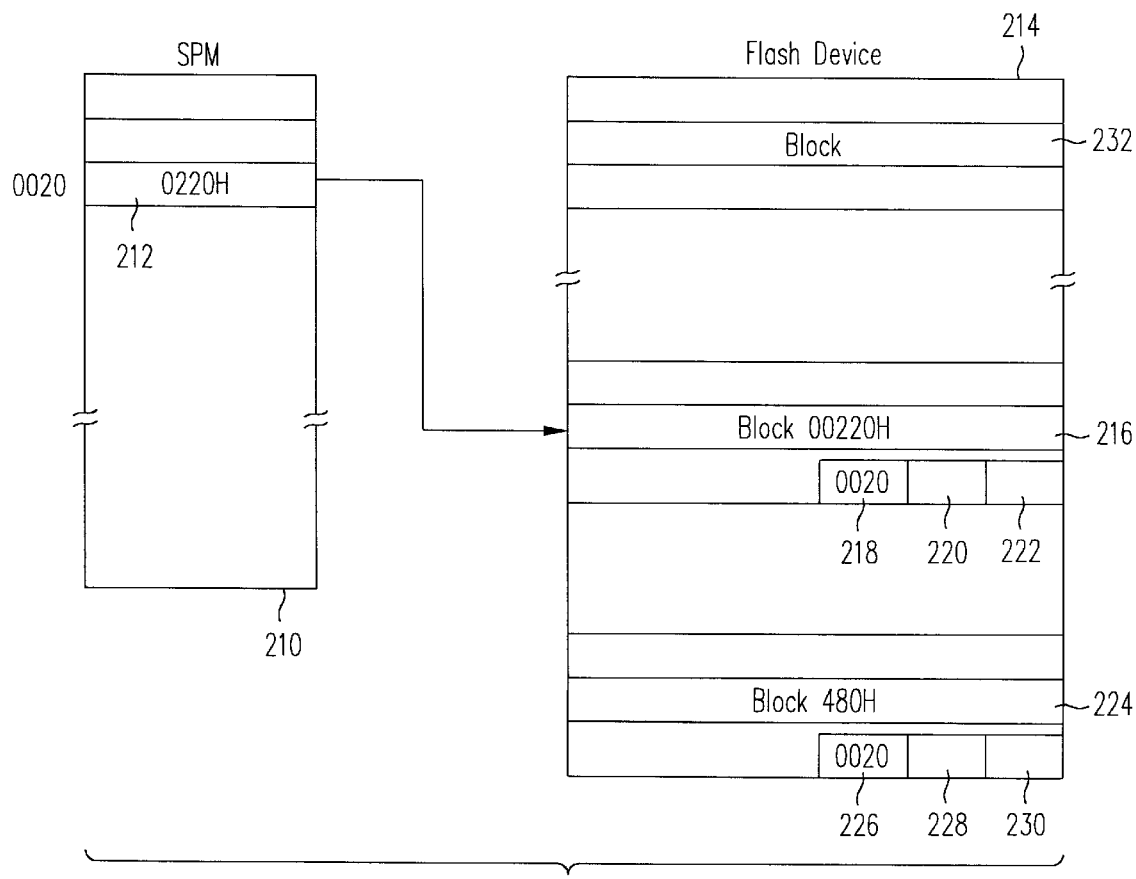
FIG. 3 depicts an example of moving a block of information within one of the flash memory devices as it is reflected in the contents of the space manager block of FIG. 1.

FIG. 3 shows the contents of the space manager block 210 where one of the VLBA values (a row of the space manager being identified by a VLBA value) is '0020' in hexadecimal notation for addressing the block '0220' in hexadecimal notation within the flash memory unit and specifically within the flash device 214, in FIG. 3. As shown in FIG. 3, the value '0220' is used as a VPBA value to point to a particular location within the flash device 214 that is identified by the PBA value '0220'. The identified block is referenced by the 216 in FIG. 3 within the flash device 214. Within the block 216, there is stored in the last row of the block, a VLBA value of '0020' in hexadecimal notation in a VLBA field 218. This is so as to identify the block 216 as belonging to the VLBA '0020' such that when power is for some reason interrupted and then turned on again and the contents of the space manager 210 are lost, the space manager contents may be nevertheless reconstructed from the information in the flash device 214. For example, when power is turned on, the last row of the block 216 is checked and particularly the VLBA field 218 is read. Since the latter includes the value '0020', the corresponding row to this VLBA value is reached in the space manager and a value of '0220' is placed in that row.

In FIG. 3, each of the blocks, such as block 216, 224 and a block 232 include a plurality of sectors, such as 16, 32 or any other number, $2^N$ with N being an integer. Each sector includes data and ECC information.

In the block 216 in FIG. 3, there is further stored, a block status flag field 220 and a defect field 222, which identify certain information regarding the block 216 as discussed earlier hereinabove. Further shown within the flash device 214 is a block 224 having an address of '480' in hexadecimal. The last row of the block 224 includes a VLBA field 226, which is shown to include the value '0020' due to a move of the contents of the block 216 to the block 224, as will become apparent with respect to a later example. The block 224 further includes a block status flag field 228 and a defect field 230. The reason for showing the blocks 216 and 224 is to familiarize the reader with the concept of moving a block, such as the block 216, to another block within the flash device 214, such as the block 224, when the same block is accessed or re-written. Stated differently, when the same LBA or VLBA-identified location is being re-written prior to being erased (as the reader recalls, one of the characteristics of nonvolatile memory such as flash or EEPROM is that when it is written or programmed, it need to be erased prior to being re-written or re-programmed, however, to avoid frequent erases, the inventors of the present invention and prior inventions have designed the system so as to use a different block, having the same VLBA, when a re-write occurs), the portion of the block that is being re-written, i.e. the particular sectors of the block being re-written, are first written to another block that is identified by the same VLBA but physically is in a different location within the flash memory unit. Next, the sectors that were not re-written may be moved to the new block and the previous block can then be erased. In FIG. 3, for example, the VLBA-identified block, i.e. VLBA '0020', first points to the block 216, block '0220' within the flash device 214. However, if that same VLBA-identified location, i.e. VLBA '0020', is re-written by the host prior to the controller having an opportunity to erase the block 216, the latter block cannot physically or practically be re-programmed. Thus, another block, i.e. block 224 is identified for the re-write. The status of these blocks becomes important in that at any given time, specially during power-up, the controller must know which block is 'in use' and/or includes 'old' information and the like. This kind of information is identified by the block status flag field of each of the blocks as earlier noted. The operation of a move is perhaps best understood with an example, as shown in FIGS. 4a–4i where the host re-writes nine sectors identified by LBAs 27-2F (in hexadecimal notation).

Figure 4A:
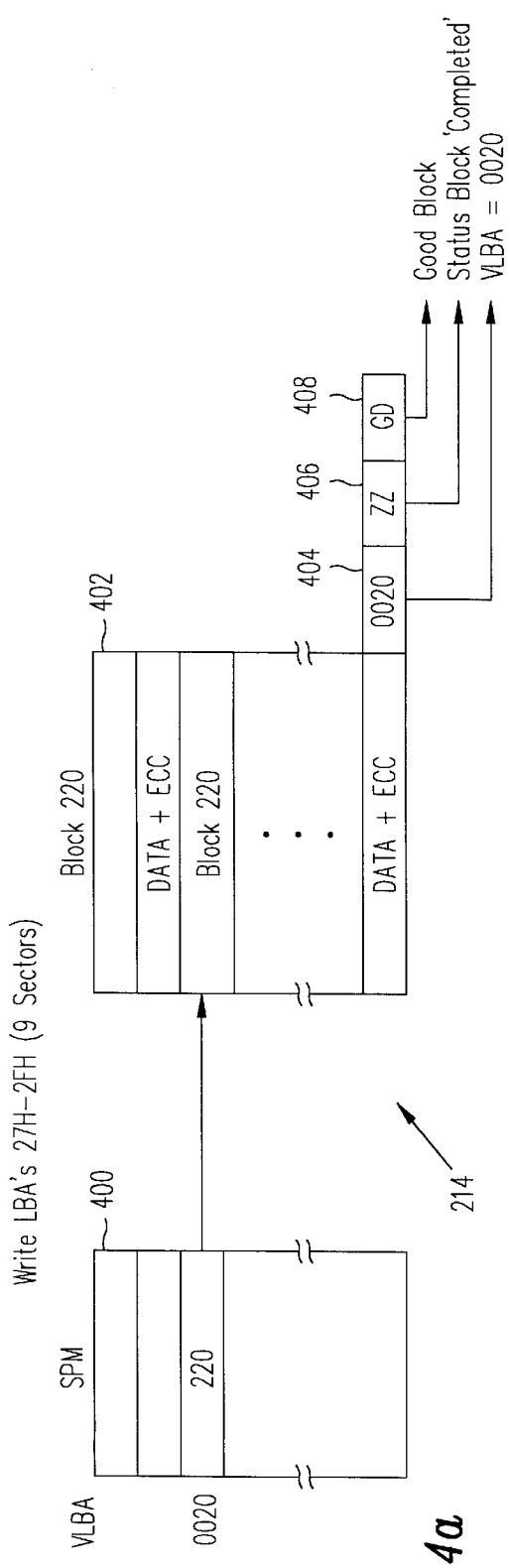
FIGS. 4a–4i show the affects on the space manager block and the blocks of the flash memory device when a block is moved from one location of the flash memory unit to another in accordance with an embodiment of the present invention.

In FIG. 4a, the space manager 400 is shown to include the value '220' in a row identified by the VLBA '20'. This row is shown because the sectors identified by LBA values 27-2F are within the block addressed by VLBA '20' since, in the example of FIGS. 4a–4i. each block includes 16 sectors. The corresponding block 220 is physically stored in the block 402 of the flash device 214 at, which includes sixteen sectors with each sector having data and ECC information and the last row of the block including a VLBA field 404, a block status flag field 406 and a defect field 408. Because the block 402 has been previously written thereto by the host, its block status flag field 406 includes a value, shown in FIG. 4a, as 'zz'. 'zz' is used here merely as a notation to denote that the block 402 is complete, i.e. designating the block 402 as 'block complete'. In actuality, 'zz' is a binary value, such as one byte, having a predetermined value that indicates 'block complete'. 'zz' and other similar nomenclature, such as 'xx' and 'yy', are used throughout this patent document to discuss the status of the block status flag field whereas, in fact, they represent a binary value.

The VLBA field 404 of the block 402 includes the value '20' to indicate the particular location within the space manager 400 to which the block 402 belongs. When power is turned on, since the contents of the flash device 214 is preserved while the contents of the space manager 400 LUT is lost due to its volatile nature, the contents of the block 402 is used to reconstruct the space manager. In fact, the contents of all of the blocks within the flash memory unit is used to reconstruct the LUT of the space manager 400. In FIG. 4a, the contents of the VLBA field 404, which is '20', is used to point to a corresponding location, or row, identified by the VLBA 20 and to store the value '220' therein.

Figure 4B:
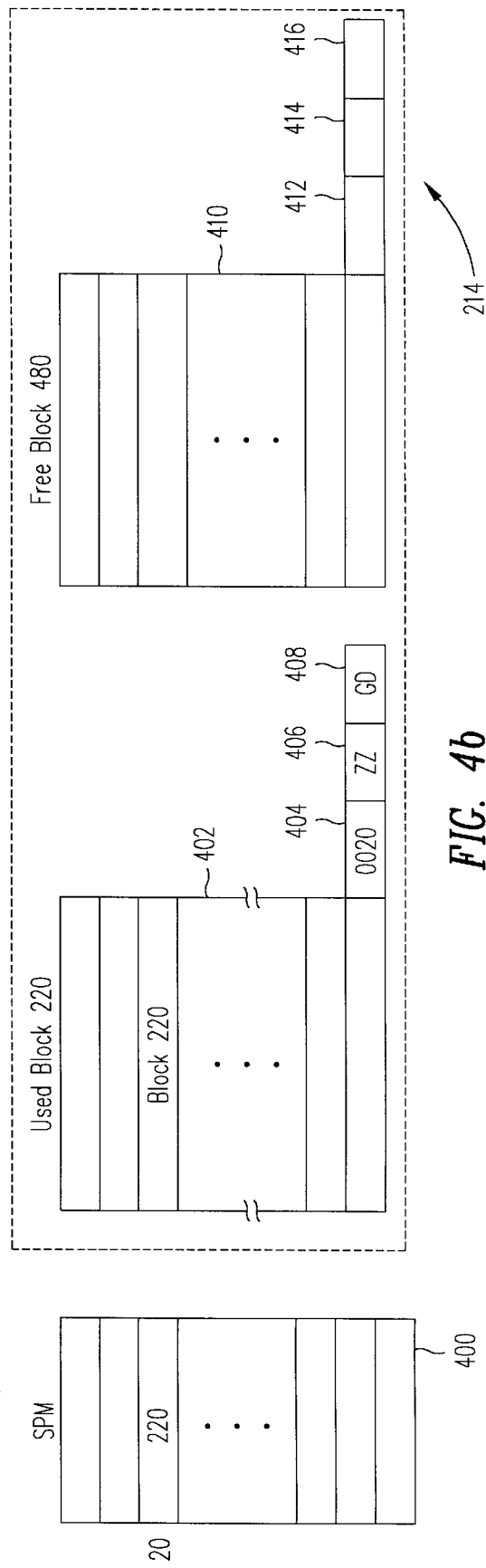

The example of writing the LBA-identified sectors 27-2F continues in FIG. 4b where a free block is located by the space manager, as the block 410. The block 410, which is identified by the VPBA value '480', includes 16 sector storage spaces and a VLBA field 412, a block status flag field 414, and a defect field 416. The status of the block 402 remains the same but since the block 410 is free at this time, there is no valid data, ECC, or information in the fields 412, 414 and 416.

Figure 4C:
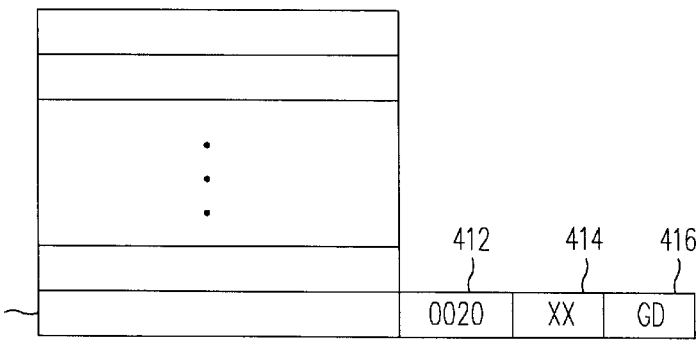

In FIG. 4c, the block 410 is marked as being 'in use'. This is done by writing an 'xx' value in the field 414 and '0020' in field 412. Again, this is not actually an 'xx' value, rather 'xx' is used herein to denote a predetermined binary value indicating that the block 410 is 'in use'. The marking of the block 410 as being 'in use' requires a write operation of sector information that is other than data, i.e. 'overhead' information. Thus, marking of the block in FIG. 4c is the first 'overhead' writing that is done in this example. As the reader will note, there will be 3 overhead writes altogether such that there are 3+16 (sector writes) or 19 write operations performed altogether.

Figure 4D:
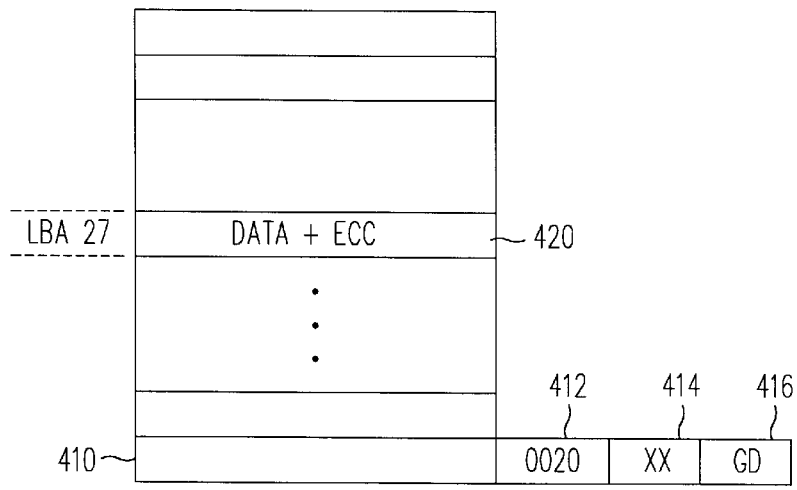

Next, in FIG. 4d, the first sector that needs to be written, i.e. the sector identified by LBA 27H, is written, as shown by the sector 420 in the block 410. The contents of the fields 412, 414 and 416 remain unchanged during this write operation. Again, the reader is reminded that this write operation is actually a re-write of the sector identified by LBA 27H. That is, the latter sector was written to previously in the block 402 having an address of '220' and is now being re-written by the host prior to erasure of the block 402. Since the block 402 cannot be written over due to lack of erasure thereof, a free block 410 is designated for storage of the new sector information.

Figure 4E:
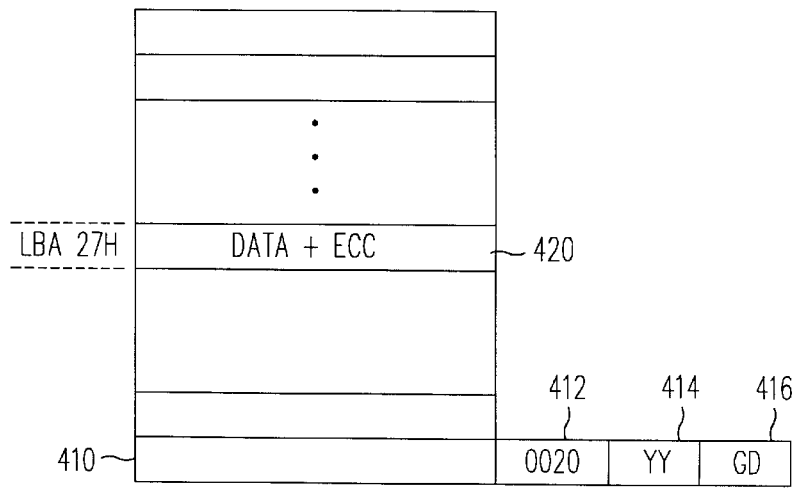

In FIG. 4e, after the sector 420 has been written, the contents of the block status flag field 414 of the block 410 is modified to 'yy' indicating that the block 410 is 'pending'. Otherwise, the remaining contents of the block 410 remains the same. This write operation is another 'overhead' write operation where no sector information is written. As the reader will note, this is the second overhead operation of the present example. In FIGS. 4c through 4e, the VLBA field 412 remains the same, i.e. '20', because this is the VLBA location corresponding to the block 410 ever since this block was found as a free block for writing thereto. Furthermore, this block is considered not to be defective, thus, the defect field 416 indicates 'GD' or a good block. As earlier noted, the defect field actually contains a binary value to indicate whether or not this block is defective.

Figures 4F, 4G:
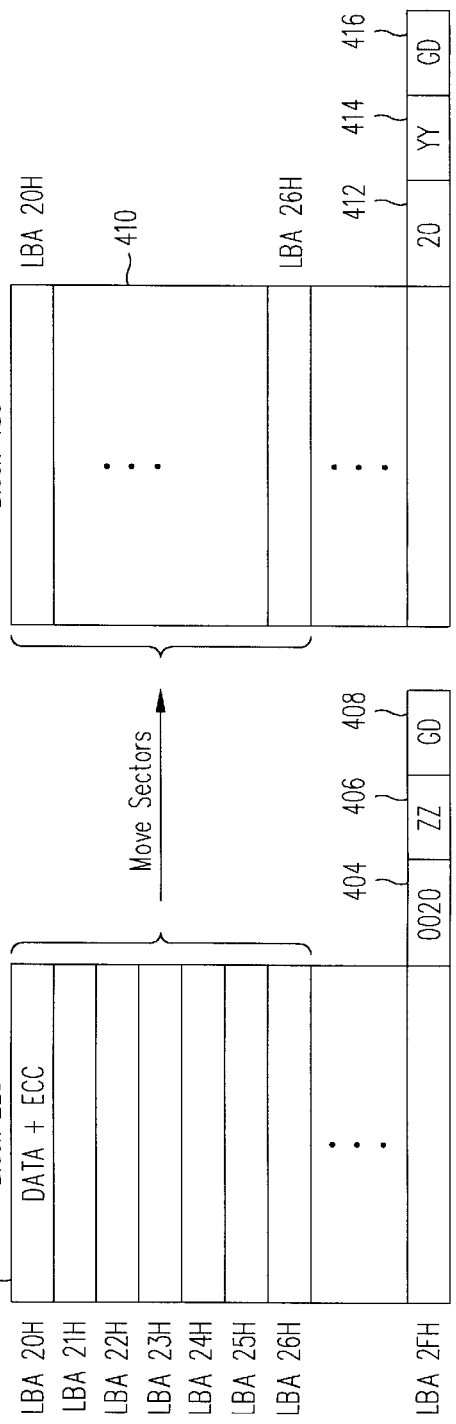

In FIG. 4f, the remaining sectors, identified by LBA values of 28-2F, are written to the block 410 in respective locations thereof. The contents of the fields 412–416 remain the same. It should be noted that by this time, in the present example, there has been a total of 11 write operations, 2 of which were 'overhead' write operations and 9 of which were sector write operations.

Figure 4H:
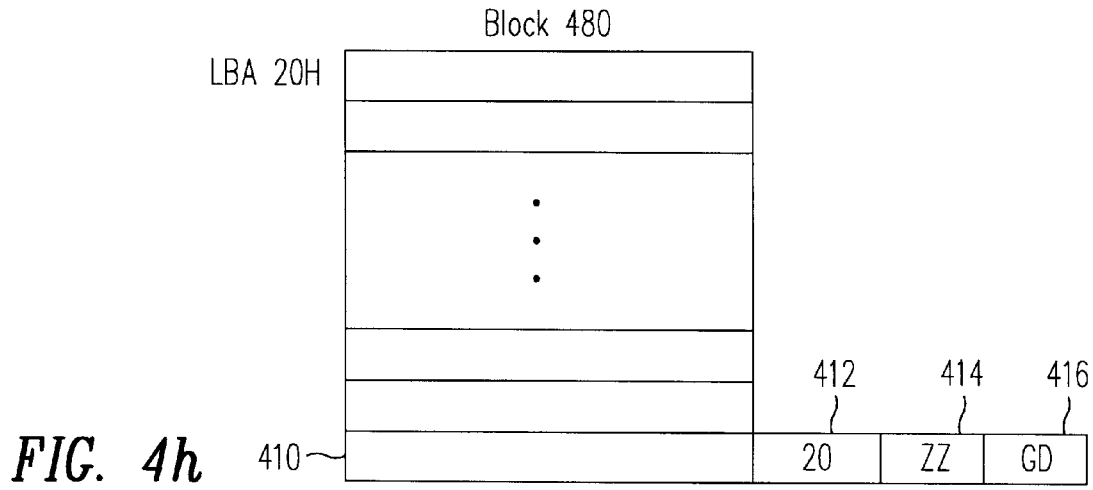

In FIG. 4g, seven additional sector write operations (or move operations) are performed where the contents of the sectors identified by LBA values 20–26 in the block 402 are read by the controller and written to corresponding blocks of the block 410. The contents of the fields 412–416 remain the same. At this point, Block 220 is erased. In FIG. 4h, a last write operation is performed to modify the contents of the block status flag field 414 of the block 410 to 'zz', which indicates a 'block complete' status, 'block complete' status signifies that the block has been completely written thereto. It should be noted that this is the same status as that of the block 402. There is now a total of 19 write operations having been performed.

Throughout this document, there are references made to modifying the contents of the block status flag field wherein such modifications are performed prior to erasure of the block containing the block status flag field. This may raise a question in the reader's mind as to how the block status flag field can be updated without first being erased as this field is included within the nonvolatile memory unit, which requires erase-before-write. Briefly, this is done by assigning a number of bits, such as two bytes (each byte being 8 bits), to the block status flag field. Prior to the first updating or modification of this field after an erase operation of the block within which the field resides, the value in this field is all '1's in binary notation or 'FFFF . . . ' in hexadecimal notation. There is a predetermined value assigned to each status of the block. For the sake of explanation, assuming a value of '11111100' (in binary notation or 'FC' in hexadecimal notation) is assigned to a status 'xx', then the two least-significant-bits (LSBs) of the field are modified from '1's to '0' to obtain the value '11111100' (in binary notation). Thereafter, when the field must be updated to a value reflecting a status of 'yy, and assuming this value to be '11110000' (in binary notation or 'F0' in hexadecimal notation), the third and fourth LSBs are programmed to '0's and the remainder of the bits remain unchanged. Finally, a value representing the 'zz' status, for example, may be '11000000' where the fifth and sixth LSBs are programmed to '0's with the remainder of the bits remaining unchanged. Accordingly, the block status flag field may be modified by changing the status of the bits that are at logical state '1' to a '0' while leaving the bits that are already at logical state '0' the same. This eliminates the need to erase the field each time it needs to be modified.

In accordance with the present invention, during power-up, when the blocks of the flash memory unit are read for reconstructing the space manager LUT, the block status flag field of each of the blocks indicates the status of the block as being 'in use', which signifies the block as having been designated for use although there is no valid data stored in the block yet, or 'pending' which signifies that the first sector has been written to the block, or 'block complete', which signifies that the block has been completely written thereto.

Figure 4I:
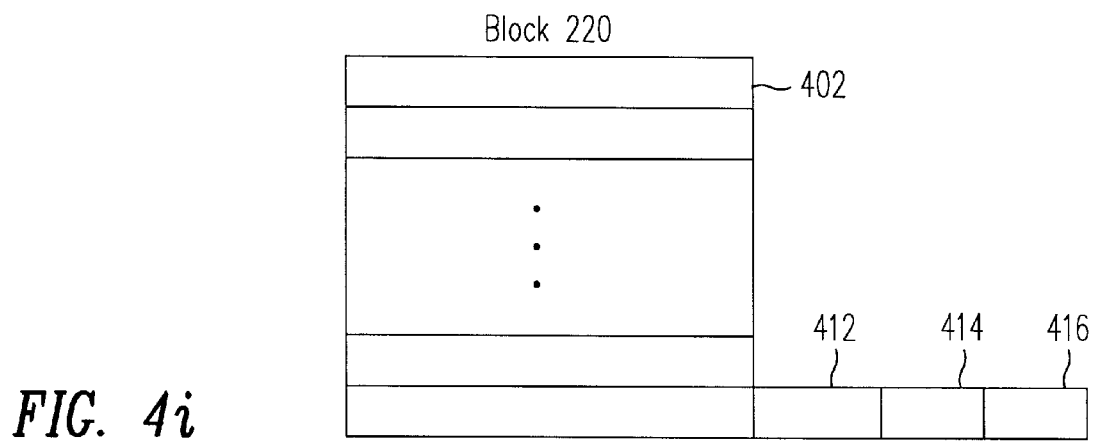

In FIG. 4i, the block 220 is erased because as soon as the block 410 is marked 'block complete', the block 220 is erased.

In an alternative embodiment of the present invention, the block status flag field can take on two values rather than three thereby eliminating one 'overhead' write operation. That is, the first status, 'xx', is not actually noted resulting in an overall write operation count of 18 rather than 19. This is done by reducing modification of the field 414 of the block 410 where the first modification of the status thereof can be shown as pending. Sector information is still written to the block as shown in the example above with reference to FIGS. 4a–4i.

In yet another embodiment of the present invention, the performance of the system is further improved wherein, to re-write a block or a portion thereof, only as many write operations as there are sectors in a block plus one additional write operation are performed. For example, where a block includes 16 sectors, 17 write operations would be performed when re-writing to one or more sectors of a block, as will be demonstrated by an example shown in FIG. 5.

Figure 5:
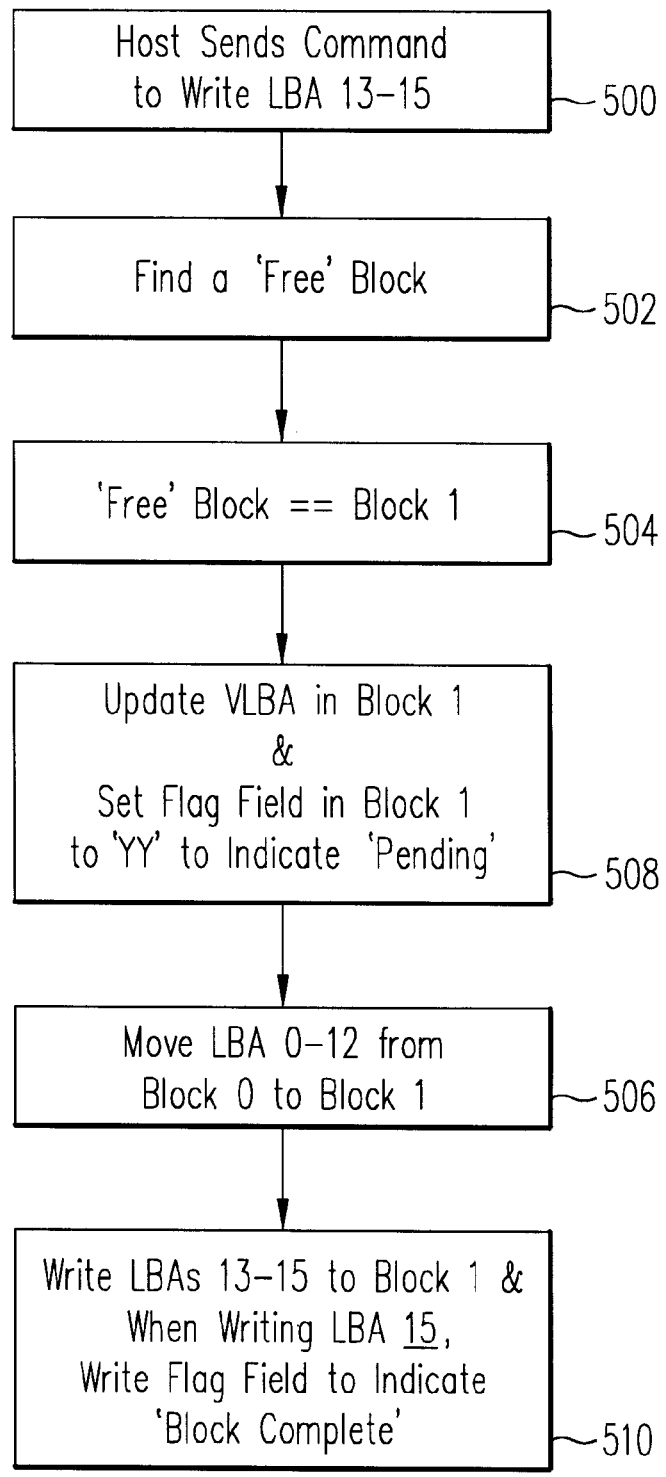
FIG. 5 shows a flow chart of the steps performed during a write operation in accordance with an alternative embodiment of the present invention wherein 17 write operations are performed when re-writing a block.

In FIG. 5, a flow chart is presented to show the steps performed in re-writing sectors identified by LAB 13, 14 and 15 of Block 0. At 500, the host sends a command to the controller to write to the sector storage locations in the nonvolatile memory unit, identified by LBA 13–15, which have been previously written to in Block 0. The controller recognizes this as being a re-write of these particular sectors and at step 502, the space manager searches for a free block in the same location, i.e. Block 0, that was previously written thereto and cannot now be re-written unless it is first erased.

At step 504, consider the case where the free block that is found by the space manager to be Block 1. At step 508, the VLBA field and the block status flag field in Block 1 are updated. The block status flag field in Block 1 is programmed to 'yy' for indicating the status of Block 1 as 'pending'. The write operation at step 508 is one write operation and it is the first 'overhead' write operation performed when writing Block 1, as commanded by the host. It should be noted, as earlier discussed herein, that 'yy' is actually a predetermined binary value.

Next, at step 506, there are 13 write operations performed, each write operation is for moving an LBA-identified sector from Block 0 to Block 1. For example, the contents of the sector identified by LBA 0 is read from Block 0 and written to the corresponding sector of Block 1—LBA 0 of Block 1. The same is done for the remaining 12 sectors that are being transferred from Block 0 to Block 1.

Finally, at step 510, the new information, i.e. the sector information identified by the host at LBAs 13–15, is written to Block 1. Note that this is not a transfer of like-sectors from Block 0 to Block 1. Rather, there is new sector information being written to Block 1. That is, since the LBAs 13–15 are being updated, the sector information in the sectors, identified by LBAs 13–15 in Block 0, need not be moved to Block 1. As the last sector, i.e. the sector identified by LBA 15, is being written, within the same write operation, the block status flag field in Block 1 is also modified to 'zz' for indicating the status of Block 1 as being 'block complete'. Step 510 entails 3 more write operations thereby bringing the total write operation count for a 16-sector block to 17—sixteen data write operations and one 'overhead' write operation. In this manner, the number of write operations is reduced thereby increasing system performance, particularly in applications where many write and re-write operations need be performed. After the above steps in FIG. 5, the contents of Block 0 may be erased after which Block 0 is returned to the pool of 'free' or available blocks for further storage use.

In still another embodiment of the present invention, system performance is further improved by performing the same number of write operations as there are sectors within a block and no more. This is best understood by the use of an example depicted in FIGS. 6a and 6b. FIG. 6a shows the status of the Block 0 in the nonvolatile memory unit 602 when writing LBAs 5–15 for the first time after an erase operation and FIG. 6b shows the status of Blocks 0 and 1 when re-writing LBAs 5–15.

In FIG. 6a, when the host commands the controller to write sector information to locations identified by LBA 5–15, the controller determines whether or not e the sectors identified by LBA 5–15 have been previously written. In this case, they will not have been and therefore a 'free' block is identified for such a write transaction. In this case, the 'free' block is Block 0. Block 0 is comprised of 16 sectors, s0–s15, with each sector having at least a data field and an ECC field. The first sector, s0, of Block 0 also includes a VLBA field 604 for storing VLBA information and the last sector. s15, includes a block status flag field 606 for storing block status information.

First, an 'overhead' write operation is performed to write the appropriate VLBA value (this value is determined as described hereinabove with respect to earlier figures) in the VLBA field 604 of the first sector, s0. Next, data and ECC is written to each of the sectors identified by the LBA values 5–15, which requires 11 write operations and while writing the last sector, s15, the block status flag field 606 is written to indicate 'zz' or 'block complete'.

In FIG. 6b, assuming the host commands the controller to write to the LBAs 5–15 again, the nonvolatile memory unit 602 is modified as follows. The controller determines that these LBAs have been previously written in Block 0. Thus, a 'free' block, Block 1, is located and information in the sector storage locations are identified by LBA 0–4, i.e. s0–s4, are moved from Block 0 to Block 1. When the first sector, s0, is being written by the controller, the VLBA is also written into the VLBA field 608 thus avoiding the need for an extra write operation. Next, new information, provided by the host, is written into the sectors s5–s15 of Block 1 in sequential order and using 11 write operations. While writing the last sector, s15, the block status flag is also written into the block status flag field 610 of the Block 1, as 'zz' to indicate 'block complete'. As discussed earlier. 'zz' is actually a binary value that is a bye in length. Accordingly, an entire block is written with only 16 write operations as there are no extra 'overhead' write operations necessary. Thereafter, the contents of Block 0 is erased and Block 0 is returned to the pool of 'free' blocks for further storable use.

During power-up, as happens after an abrupt or typically power-down of the system, the contents of the LUT in the space manager is lost because the LUT is maintained in volatile memory, which looses its contents when no power is provided thereto. Accordingly, the controller must reconstruct the contents of the LUT during power-up so as to provide the requisite mapping between host-provided sector addresses and the addresses used to read and write information from and to the nonvolatile memory unit.

During power-up, the controller performs two read operations for each block within the nonvolatile memory unit in order to determine the status of the block. This is best understood by providing an example. Consider the case where a number of the sectors in Block 0 were being re-written to Block 1 but the re-write and move of previously-written sectors was not yet completed before there was a power-down. Further consider that the VLBA 20 in the space manager, prior to power down, points to the Block 0, i.e. row 20 (in Hexadecimal notation) of the LUT includes an address identifying Block 0 in the nonvolatile memory unit. Because some of the sectors in Block 0 were undergoing a transfer to Block 1, the status flag of Block 0 will indicate 'zz' or 'block complete' and because the transfer of the sectors was not yet completed, the status flag of Block 1 will indicate 'FF.'. 'FF.' is the status of flash cells when they have not yet been programmed. As the reader recalls, in the case where only 16 write operations are required to re-write a block, the status flag is updated only when the last sector, i.e. sector 15, written. In this case, because not all of the sectors have yet been written to Block 1, the contents of the last sector thereof. i.e. s15 of Block 1, will remain unprogrammed, or be at 'FFFF . . . '.

During power-up, the controller reads the contents of the first sector, s0, in Block 1 to retrieve the VLBA value. In this case, the VLBA will be '20' (in Hexadecimal notation). Next, the controller reads the contents of the last sector, s15, of Block 1, which will indicate that the status flag is 'FF.'. This tells the controller that Block 1 was being written thereto but the write operation is not yet complete. It should be noted that the VLBA field of Block 0 will include the same VLBA value as that of Block 1, i.e. '20'. The controller thus looks for the block within the nonvolatile memory unit to find the same VLBA as that included in Block 1 and finds Block 0 as having that same value, 20. Accordingly, the controller knows to transfer all sectors that have not yet been moved from Block 0 to Block 1. The controller knows which sectors to move according to the contents of the sectors because with respect to sectors that were previously written, their contents will be values other than 'FFFF . . . ' and with respect to sectors that were not yet written, their values will be all 'FFFF . . . '

The sectors that need to be moved from Block 0 to Block 1 that have not yet been moved, will be transferred to Block 1 and the status flag field in Block 1 will be programmed as 'zz' or 'block complete'. The controller then updates Row '20' in the LUT of the space manager to include the address of the Block 1.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A solid state storage system for use with a host and a nonvolatile memory unit, the host for reading and writing digital information organized in sectors from and to the nonvolatile memory unit, the nonvolatile memory unit including one or more nonvolatile memory devices, each nonvolatile memory device including at least one block having a plurality of sector storage spaces for storing the sector information, each sector storage space including storage space for storing data and overhead information, comprising:

a controller device coupled between the host and the nonvolatile memory unit for re-writing a particular group of sector information identified by the host, the particular group of sector information included within a previously-written block of the nonvolatile memory unit, the controller device for identifying a free block and configuring the free block to include at least two sector storage spaces, a first sector storage space and a second sector storage space, the first sector storage space including a data storage field and an overhead storage field wherein the first overhead storage field includes an address field for storing an address value identifying the free block, the second sector storage space including a data storage field and an overhead storage field wherein the second overhead storage field includes a flag field indicative of the status of the free block, the controller device for performing a write operation on the first sector storage space to write data in the data storage field and the address value into the address field, the controller device for performing further write operations to write the particular group of sector information and for performing yet further write operations to move sector information from the previously-written block into like-sector storage spaces within the free block and upon writing sector information to the second storage space, the controller for modifying the contents of the flag field to indicate completion of writing to the free block, wherein the number of write operations during re-writing of a block is no more than the number of sector storage spaces within a block thereby increasing the overall performance of the system.

2. A solid state storage system as recited in claim 1 wherein the address value is a Virtual Logical Block Value (VLBA) identifying the free block for use by the controller device.

3. A solid state storage system as recited in claim 1 wherein completion of writing to the free block is indicated by a binary value representing status of the free block as being 'block complete'.

4. A solid state storage system as recited in claim 1 wherein the controller device includes a Look-Up-Table (LUT) for storing mapping information between host-provided sector addresses and blocks within the nonvolatile memory unit wherein corresponding sector storage locations are located.

5. A solid state storage system as recited in claim 4 wherein during power-up, the controller device for reading the contents of the address field and the flag field and if according to the contents of the flag field, no information has been programmed therein, the controller for using the contents of the address field to determine the block from which sectors are being transferred and for completing the transfer of the sectors to the free block and for modifying the LUT to reflect the current correspondence between the address value and the free block.

6. A solid state storage system as recited in claim 1 wherein the first sector storage space is the first sector storage space of the free block.

7. A solid state storage system as recited in claim 1 wherein the second sector storage space is the last sector storage space of the free block.

8. A solid state storage system for use with a host and a nonvolatile memory unit, the host for reading and writing digital information organized in sectors from and to the nonvolatile memory unit, the nonvolatile memory unit including one or more nonvolatile memory devices, each nonvolatile memory device including at least one block having a plurality of sector storage spaces for storing the sector information, each sector storage space including storage space for storing data and overhead information, comprising:

a controller device coupled between the host and the nonvolatile memory unit for re-writing sector information to a particular group of sector storage spaces identified by the host, the particular group of sector storage spaces having been written thereto previously by the host, the controller device for identifying a free block having a plurality of sector storage spaces and configuring one of the sector storage spaces to include a status flag field for storing a status flag value indicative of the status of the free block, the controller device for modifying the status flag value to indicate that the free block is 'in use', for writing sector information to one of the particular group of sector storage spaces, for further modifying the status flag value to indicate that the free block is 'pending', for writing sector information to the remainder of the particular group of sector storage spaces, for performing write operations to transfer the contents of previously-written sector storage spaces that are not being re-written to the free block and for further modifying the status flag value to indicate that the free block is 'block complete', wherein the number of write operations for re-writing a block is reduced to the number of sector storage spaces within a block plus three additional write operations thereby increasing the overall performance of the system.

9. A solid state storage system as recited in claim 8 wherein the status flag field is within the last sector storage space of the free block.

10. A solid state storage system as recited in claim 8 wherein the controller device includes means for erasing the previously-written sector storage spaces.

11. A solid state storage system as recited in claim 8 wherein the free block further includes an address field for storing address information identifying the free block within the nonvolatile memory unit.

12. A solid state storage system as recited in claim 8 wherein the free block further includes a flag field indicative of whether or not the free block is defective.

13. A method for reducing the number of write operations performed in a solid state storage system for re-writing a block of information in nonvolatile memory, the solid state storage system including a host for reading and writing digital information organized in sectors from and to the nonvolatile memory unit under the control of a controller device, the nonvolatile memory unit including one or more nonvolatile memory devices, each nonvolatile memory device including at least one block having a plurality of sector storage spaces for storing the sector information, each sector storage space including storage space for storing data and overhead information, the method comprising:

identifying a particular group of sector information a controller device coupled between the host and the nonvolatile memory unit for re-writing a particular group of sector information, the particular group of sector information included within a previously-written block of the nonvolatile memory unit;

identifying a free block within the nonvolatile memory unit for storage of the particular group of sector information;

configuring the free block to include at least two sector storage spaces, a first sector storage space and a second sector storage space, the first sector storage space including a data storage field and an overhead storage field, the first overhead storage field having an address field for storing an address value identifying the free block, the second sector storage space including a data storage field and an overhead storage field, the second overhead storage field having a status flag field indicative of the status of the free block;

performing a write operation on the first sector storage space wherein data is written in the data storage field and the address value is written into the address field;

performing further write operations wherein the particular group of sector information is written into the free block;

performing yet further write operations wherein sector information is moved from sector storage spaces of the previously-written block into like-sector storage spaces within the free block: and upon writing sector information to the second storage space of the free block, modifying the contents of the status flag field to indicate completion of writing to the free block.

14. A solid state storage system for use with a host and a nonvolatile memory unit, the host for reading and writing digital information organized in sectors from and to the nonvolatile memory unit, the nonvolatile memory unit including one or more nonvolatile memory devices each nonvolatile memory device including at least one block having a plurality of sector storage spaces for storing the sector information, each sector storage space including storage space for storing data and overhead information, comprising:

a controller device coupled between the host and the nonvolatile memory unit for re-writing sector information to a particular group of sector storage spaces identified by the host, the particular group of sector storage spaces having been written thereto previously by the host, the controller device for identifying a free block having a plurality of sector storage spaces and configuring one of the sector storage spaces to include a status flag field for storing a status flag value indicative of the status of the free block, the controller device for transferring the contents of previously-written sector storage spaces to like-sector storage spaces within the free block, for modifying the status flag value to indicate that the status of the free block is 'pending', for writing sector information to the particular group of sector storage spaces within the free block and while writing to the last one of the particular sector storage spaces, modifying the status flag to indicate that the status of the free block is 'block complete, wherein the number of write operations for re-writing a block is reduced to the number of sector storage spaces within a block plus one additional write operation thereby increasing the overall performance of the system.

15. A solid state storage system as recited in claim 14 wherein the status flag field is within the last sector storage space of the free block.

16. A solid state storage system as recited in claim 14 wherein the controller device includes means for erasing the previously-written sector storage spaces.

17. A solid state storage system as recited in claim 14 wherein the free block further includes an address field for storing address information identifying the free block within the nonvolatile memory unit.

18. A solid state storage system as recited in claim 14 wherein the free block further includes a flag field indicative of whether or not the free block is defective.

* * * * *